United States Patent
Biber (10) Patent No.: US 10,281,533 B2
(45) Date of Patent: May 7, 2019

(54) MRT LOCAL COIL POSITION DETECTION IN AN MRT SYSTEM

(71) Applicant: Stephan Biber, Erlangen/Frauenaurach (DE)

(72) Inventor: Stephan Biber, Erlangen/Frauenaurach (DE)

(73) Assignee: Siemens Aktiengesellschaft, München (DE)

( * ) Notice: Subject to any disclaimer, the term of this patent is extended or adjusted under 35 U.S.C. 154(b) by 1875 days.

(21) Appl. No.: 13/743,226

(22) Filed: Jan. 16, 2013

(65) Prior Publication Data

US 2013/0181715 A1    Jul. 18, 2013

(30) Foreign Application Priority Data

Jan. 17, 2012  (DE) .................. 10 2012 200 600

(51) Int. Cl.
| | |
|---|---|
| *G01V 3/00* | (2006.01) |
| *G01R 33/28* | (2006.01) |
| *G01R 33/36* | (2006.01) |
| *G01R 33/341* | (2006.01) |
| *G01R 33/3415* | (2006.01) |

(52) U.S. Cl.
CPC ............ *G01R 33/28* (2013.01); *G01R 33/36* (2013.01); *G01R 33/341* (2013.01); *G01R 33/3415* (2013.01)

(58) Field of Classification Search
CPC ...... G01R 33/28; G01R 33/36; G01R 33/341; G01R 33/3415; G01S 7/003
USPC ................................................. 324/318, 322
See application file for complete search history.

(56) References Cited

U.S. PATENT DOCUMENTS

| | | | | | |
|---|---|---|---|---|---|
| 4,638,252 | A | * | 1/1987 | Bradshaw | G01R 33/28 324/300 |
| 5,551,430 | A | * | 9/1996 | Blakeley | A61B 5/0555 324/318 |
| 6,317,619 | B1 | * | 11/2001 | Boernert | G01R 33/341 324/307 |
| 7,180,294 | B2 | * | 2/2007 | Kohlmuller | A61B 5/0555 324/318 |
| 7,663,366 | B2 | * | 2/2010 | Takamori | G01R 33/28 324/307 |
| 7,696,754 | B2 | | 4/2010 | Kess | |
| 7,940,047 | B2 | * | 5/2011 | Hansen | G01R 33/36 324/318 |

(Continued)

FOREIGN PATENT DOCUMENTS

| | | |
|---|---|---|
| CN | 1959428 A | 5/2007 |
| CN | 101194528 A | 6/2008 |

(Continued)

OTHER PUBLICATIONS

Chinese Search Report for related Chinese Patent Application No. 201310013784.7, dated Jan. 19, 2016, with English Translation.

(Continued)

*Primary Examiner* — Louis M Arana
(74) *Attorney, Agent, or Firm* — Lempia Summerfield Katz LLC (57) ABSTRACT

Magnetic resonance tomography (MRT) local coil positioning by RFID is enabled with a positioning device to detect a position of a first object relative to a position of an additional object that includes at least one RFID tag arranged on the first object and/or at least one RFID reader arranged on the additional object.

26 Claims, 7 Drawing Sheets

(56) References Cited

U.S. PATENT DOCUMENTS

| | | | |
|---|---|---|---|
| 8,294,554 B2* | 10/2012 | Shoarinejad | G01S 7/003 340/10.1 |
| 8,587,312 B2* | 11/2013 | Biber | G01R 33/34007 324/318 |
| 2006/0164086 A1 | 7/2006 | Kohlmuller | |
| 2006/0232275 A1* | 10/2006 | Leussler | G01R 33/3692 324/322 |
| 2007/0103157 A1 | 5/2007 | Campagna | |
| 2007/0257800 A1* | 11/2007 | Yang | A61N 1/08 340/572.7 |
| 2009/0102639 A1 | 4/2009 | Bozionek et al. | |
| 2009/0281419 A1 | 11/2009 | Troesken et al. | |
| 2010/0156421 A1* | 6/2010 | Sukkau | G01R 33/3415 324/318 |
| 2010/0176800 A1 | 7/2010 | Biber et al. | |
| 2010/0272229 A1 | 10/2010 | Biber et al. | |
| 2010/0289492 A1 | 11/2010 | Biber et al. | |
| 2011/0263969 A1 | 10/2011 | Fontius | |
| 2012/0306494 A1* | 12/2012 | Yang | G01R 33/4808 324/318 |
| 2013/0076490 A1 | 3/2013 | Becker et al. | |

FOREIGN PATENT DOCUMENTS

| | | |
|---|---|---|
| CN | 101578064 A | 11/2009 |
| CN | 101887108 A | 11/2010 |
| CN | 202288286 U | 7/2012 |
| DE | 10 2006 029 122 A1 | 12/2007 |
| DE | 10 2009 004 448 A1 | 7/2010 |
| DE | 10 2009 021 026 A1 | 11/2010 |
| DE | 10 2009 018 282 A1 | 12/2010 |
| DE | 10 2009 056 642 A1 | 6/2011 |
| EP | 2 362 235 A1 | 8/2011 |
| JP | 2008537502 A | 9/2008 |
| JP | 2009540895 A | 11/2009 |

OTHER PUBLICATIONS

Korean Office Action for related Korean Application No. 10-2013-0004355, dated Apr. 4, 2016.
Korean Office action for related Korean Application No. 10-2013-0004355, dated Jun. 23, 2015, with English Translation.
RFID http://de.wikipedia.org/wiki/RFID (Stand: Jun. 24, 2011).
German Office Action dated Aug. 6, 2012 for corresponding German Patent Application No. DE 10 2012 200 600.1 with English translation.
Korean Office Action for related Korean Application No. 10-2013-0004355 dated Oct. 31, 2016.
Korean Notice of Allowance for Korean Application No. 10-2013-0004355, dated Jan. 31, 2017.

* cited by examiner

MRT LOCAL COIL POSITION DETECTION IN AN MRT SYSTEM

This application claims the benefit of DE 10 2012 200 600.1, filed on Jan. 17, 2012, which is hereby incorporated by reference.

BACKGROUND

The present embodiments relate to devices and methods for detecting a position of at least one magnetic resonance tomography (MRT) local coil in an MRT system.

Magnetic resonance devices (e.g., MRTs) for examining objects or patients using magnetic resonance tomography are, for example, known from U.S. Pat. No. 7,696,754B2, DE102009021026 A1, DE102009018282 A1, DE102009004448 A1, and CN101887108A.

In nuclear spin tomography, local coils are positioned on a table (PTAB).

To improve the workflow, the MRT system may automatically move a region of interest (RoI) of a patient to be examined using imaging into the center of a magnetic homogeneity volume (e.g., field of view (FoV)), and start the imaging MRT examination of the RoI there. For this purpose, where the ROI is located on the table should be known.

In the case of certain local coils, the RoI is largely defined by the local coil (e.g., in the case of a chest coil, the chest region is examined). The local coil may therefore be used as information for the RoI. The system knows, for example, via local coil identification, which local coil is connected but not necessarily where precisely this local coil was positioned on the table.

Known methods, in which a first movement of the table that moves the patient into the measuring volume FoV after positioning on the table, are based on mechanical coding. For example, for the chest coil, holes/slits are indicated in the patient table PTAB, and the local coil is mechanically shaped such that the local coil is to be positioned in the hole in the table using a small "lug." Using detection (e.g., identification) of the local coil, the system then adopts a fixed position of the local coil on the table, which is indicated in a software file (e.g., as a distance from an end of the table). The information with regard to PTAB movement (e.g., where the PTAB should move to) is therefore obtained from a combination of local coil identification, mechanical coding and software information.

This implementation may have the following disadvantages. The local coils positioned on the PTAB may, for example, be relatively large in the case of a chest coil and are defined by small mechanical retention devices in the z position. This is disadvantageous because it is difficult to put the relatively large part into a small hole. It is easy for the local coil to be incorrectly positioned and for the mechanical coding not to work correctly. The system then moves the patient to a suboptimal position. For some applications, positioning at only one mechanically fixed predetermined point may be disadvantageous because with the different body sizes of patients, the knees, for example, may come to rest at somewhat different z positions. For example, for very large women, a more flexible positioning of the chest coil in the z direction may result in greater comfort for the patient.

In general, the concept of mechanical coding may have the disadvantage that a patient is to be positioned on the table relative to a predefined position of the local coil, and the positioning of the patient from the point of view of the workflow or of patient comfort is less possible. This applies, for example, in the case of a knee coil where it is clearly apparent where precisely the knee is positioned after the patient is lying on the table. For this application too, being able to position the coil more independently of mechanical markers with simultaneous detection of the coil position is desirable.

SUMMARY

The present embodiments may obviate one or more of the drawbacks or limitations in the related art. For example, local coil position detection is further optimized.

DETAILED DESCRIPTION OF THE DRAWINGS

Figure 7:
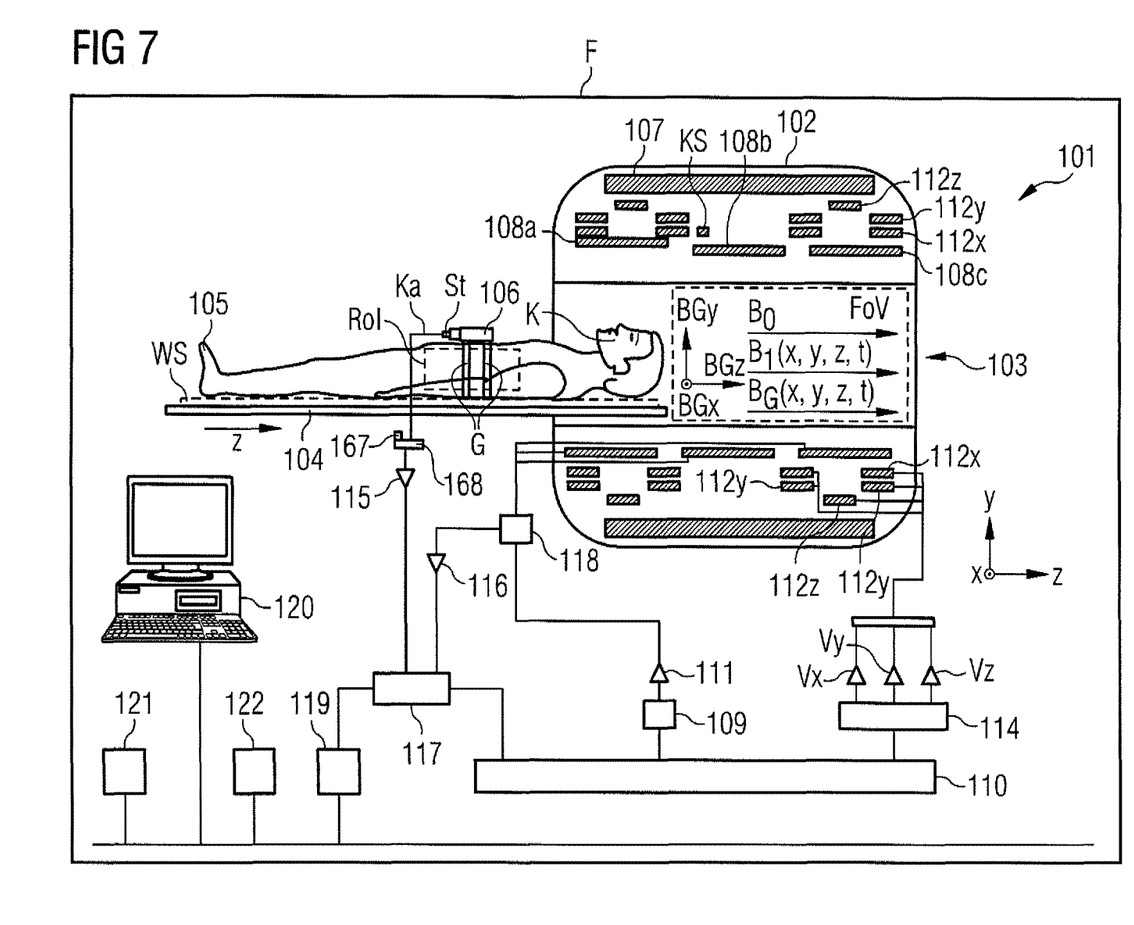
FIG. 7 shows a schematic representation of one embodiment of a magnetic resonance tomography (MRT) system.

FIG. 7 shows one embodiment of an imaging magnetic resonance tomograph MRT 101 (e.g., in a screened room or Faraday cage F) with a whole-body coil 102 with a tubular space 103, for example, into which a patient table 104 with a body 105 (e.g., of an object for examination such as a patient; with or without local coil arrangement 106) may be moved in the direction of the arrow z to generate recordings of the patient 105 using an imaging method. In one embodiment, the local coil arrangement 106 is arranged on the patient. Recordings of a partial area of the body 105 may be generated with the local coil arrangement 106 in a local area in a field of view (FOV) of the MRT 101. Signals of the local coil arrangement 106 may be evaluated by, for example, an evaluation device (e.g., including elements 168, 115, 117, 119, 120, 121) of the MRT 101 that may be connected to the local coil arrangement 106 via coaxial cable or by radio (e.g., element 167) and, for example, converted into images, stored or displayed.

In order to examine the body 105 (e.g., the object for examination or the patient) with the MRT 101 using magnetic resonance imaging, various magnetic fields precisely in tune with each other in terms of chronological and spatial characteristics are radiated onto the body 105. A strong magnet (e.g., a cryomagnet 107) in a measuring cabin with, for example, a tunnel-shaped opening 103 generates a static strong main magnetic field $B_0$ that is, for example, 0.2 Tesla to 3 Tesla or even more. Supported on the patient table 104, the body 105 for examination is moved into a more or less homogenous area of the main magnetic field $B_0$ in the FoV. Excitation of the nuclear spin of atomic nuclei of the body 105 takes place via magnetic high-frequency excitation pulses B1($x, y, z, t$) that are radiated via a high-frequency antenna (and/or if necessary, a local coil arrangement) shown in FIG. 7 highly simplified as a body coil 108 (e.g., a multipart body coil 108a, 108b, 108c). High-frequency excitation pulses are generated, for example, by a pulse generation unit 109 that is controlled by a pulse sequence control unit 110. After amplification by a high-frequency amplifier 111, the high-frequency excitation pulses are routed to the high-frequency antenna 108. The high-frequency system displayed is only indicated schematically. In other embodiments, more than one pulse generation unit 109, more than one high-frequency amplifier 111 and several high-frequency antennas 108 a, b, c are used in a magnetic resonance device 101.

The magnetic resonance device 101 has gradient coils 112x, 112y, 112z, with which magnetic gradient fields for selective layer excitation and for spatial encoding of the measured signal are emitted during measurement. The gradient coils 112x, 112y, 112z are controlled by a gradient coil control unit 114 that is connected to the pulse sequence control unit 110 just like the pulse generation unit 109.

Signals emitted by the excited nuclear spin (of the atomic nuclei in the object for examination) are received by the body coil 108 and/or at least one local coil arrangement 106, amplified by dedicated high-frequency preamplifiers 116, and processed and digitized by a receiver unit 117. The recorded measured data is digitized and stored as complex numerical values in a k-space matrix. An associated MR image may be reconstructed from the k-space matrix with values assigned by a multi-dimensional Fourier transform.

For a coil that may be operated in both send and receive mode (e.g., the body coil 108 or the local coil 106), the correct signal routing is regulated by an upstream send-receive switch 118.

An image processing unit 119 creates an image from the measured data that is shown to a user via a control panel 120 and/or is stored in a storage unit 121. A central computer unit 122 controls the individual system components.

In MR tomography, images with a high signal-to-noise ratio (SNR) are recorded with local coil arrangements (e.g., coils, local coils). The local coil arrangements are antenna systems that may be attached on (anterior), under (posterior), in the body 105, or in the immediate vicinity. In an MR measurement, the excited nuclei in the individual antennas of the local coil induce a voltage that is amplified with a low-noise preamplifier (e.g., LNA, preamp) and forwarded to the receiving electronics. To improve the signal-to-noise ratio in high-resolution images as well, high-field systems are used (e.g., 1.5 T-12 T or more). If more individual antennas may be connected to an MR receiving system than there are receivers available, a switch matrix (e.g., an RCCS), for example, is installed between the receive antennas and receiver. This routes the currently active receive channels (e.g., the receive channels that are directly in the field of view of the magnet) to the available receivers. This enables more coil elements to be connected than receivers are available, as only the coils that are in the FoV or in the homogeneity volume of the magnet are to be read out in the case of full body coverage.

For example, an antenna system is described as a local coil arrangement 106 that, for example, may include one antenna element or an array coil of several antenna elements (e.g., coil elements). These individual antenna elements are, for example, configured as loop antennas (e.g., loops), butterfly, flex coils or saddle-shaped coils. A local coil arrangement includes, for example, coil elements, a preamplifier, additional electronics (e.g., sheath wave blockers), a housing, supports and may include a cable with a plug, by which the local coil arrangement is connected to the MRT system 101. A receiver 168 attached on the system side filters and digitizes a signal received from a local coil 106 by, for example, radio and transfers the data to a digital signal processing device that may derive an image or a spectrum from the data obtained through a measurement and makes the image or the spectrum available to the user, for example, for subsequent diagnosis by him and/or storage.

FIG. 1-6 explain exemplary embodiments.

Positioning devices LA, A-Q, 110 and methods for detection of a position ($x_{RFID}$, $y_{RFID}$, $z_{RFID}$) of a first moving object 106 using RFID (e.g., of the position ($x_{RFID}$, $y_{RFID}$, $z_{RFID}$) of the first moving object in the form of a local coil 106 using RFID technology) are used before, during, or after insertion of the patient table 104 with the patient 105 into the bore 103 of the magnet of the MRT 101.

For this purpose, in an additional object (e.g., in the patient table 104 and/or a local spine coil (in/on the patient table 104) and/or in the bore 103 of the MRT system 101), an array of RFID chips A-D/A-H/A-Q (e.g., several RFID chips (RFID tags or RFID transmitters) arranged consecutively in at least one direction z) is arranged, for example, with one or more antenna RFID-At suitable for RFID transmission.

A local coil positioning system LG, A-Q on (e.g., installed in, affixed to the surface, or otherwise attached) an MRT local coil 106 may include at least one RFID reader LG and at least one RFID transmitter, RFID tag A-Q, (e.g., an RFID LG reader and several RFID transmitters, RFID tags A-Q, several RFID readers LG and an RFID transmitter, RFID tag A, or several RFID readers LG and several RFID transmitters, RFID tags A-Q).

If a local coil 106 is put on the patient table 104 and/or on a local spine coil WS (e.g., on or in the patient table), then a reader antenna LA in the local coil 106 tries to read the RFID identification information (e.g., RFID info A of the RFID chip A, RFID info B of the RFID chip B, RFID info C of the RFID chip C, RFID info D of the RFID chip D) transmitted by the RFID chips A, B, C, D, respectively, via an antenna RFID-At. For example, the RFID chips (e.g., RFID transponders) may be passive RFID transponders or semi-active RFID transponders that obtain the energy from radio signals from the reader LA (e.g., interrogator). RFID frequencies and transmission methods used may be selected from the range known from de.wikipedia.org/wiki/RFID with cross-references such that the operation is optimum in the MRT (e.g., including long waves, short waves, or decimeter waves; with capacitive or inductive or electromagnetic coupling).

As a result of the fact that the reader antenna LA and the antennas RFID-At of the RFID chips (or analogously the reader antennas LA and the antenna RFID-At of an RFID chip) only result in the successful readout of the RFID tag in certain relative spatial positions (e.g., distance and longitudinal directions) to each other, information (e.g., RFID information) about the position ($x_{RFID}$, $y_{RFID}$, $z_{RFID}$) of the local coil 106 (e.g., relative to control of the MRT known position ($x_{LA}$, $y_{LA}$, $z_{LA}$) of the RFID reader LA in 104 or WS or 103.) may be received from the successfully read out RFID tags A, B, C, D.

Figure 1:
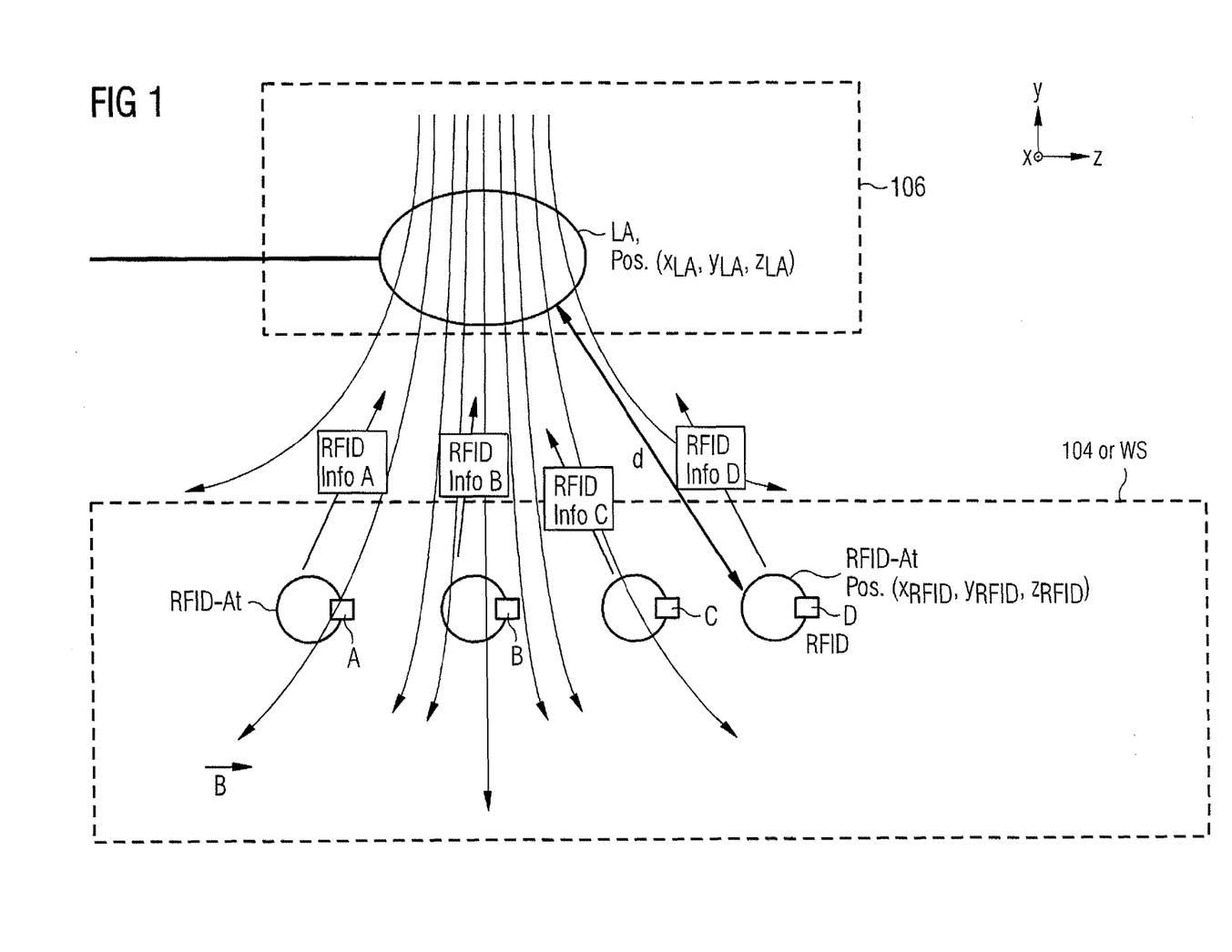
FIG. 1 shows one embodiment of a reader antenna for radio frequency identification (RFID) signals and several RFID antennas each for transmission of RFID signals.

For example, depending on the transmitting power (e.g., of the reader and/or the RFID chips A, B, C, D; if necessary, adjustable transmitting power) in FIG. 1, the reader antenna LA, on account of the different distances of RFID chips A, B, C, D from the reader antenna LA, may only receive RFID information transmitted by a nearest RFID chip B, RFID ID information transmitted by RFID chips A, B, C, or RFID information transmitted by RFID chips A, B, C, D (e.g., D is at the greatest distance d from LA). In this version, the reader antenna LA is in the local coil 106, the position of which may be detected, and the RFID tags are in positions 101, 110 known to the system.

There may also be more RFID chips A, B, C, D present than are shown (e.g., in at least one direction z more than five, more than ten, more than twenty, more than thirty, more than fifty, or more than one hundred consecutively). These are read out by a multi-tag-capable reader system. There are various known methods for avoiding collisions of the multiple tags present in the reading range during reading.

The local coil 106 may transmit a self-determined position by, for example, radio 167 or cable Ka to a control unit 117, 110 of the MRT system. The control unit 117, 110 may use the self-determined position for moving of the table 104 (e.g., motor-based moving) with the patient and the local coil 106, and a region of interest (RoI) into the FoV. The local coil 106 may alternatively transmit RFIDs received by the local coil 106 (e.g., on the basis of which, the control unit 117, 110 of the MRT system determines the position of the local coil 106 with a knowledge of the positions of the RFID chips A, B, C, D, the RFID information of which was received from the local coil) by, for example, radio 167 or cable Ka to the control unit 117, 110 of the MRT system. The control unit 117, 110 may use this for moving (e.g., motor-based moving) of the table 104 with the patient and the local coil 106, and the RoI into the FoV.

The spatial restriction of the maximum possible and, if necessary, location-dependent RFID readout range d is used to locate the local coil 106 (e.g., to determine the position of the local coil 106 in one direction z, two directions x, z, or three directions x, y, z).

The spatial restriction of the maximum possible RFID readout range d may be varied by a layout of the reader antenna LA, a layout of the antennas RFID-At of RFID tags, a sensitivity of the RFID tag, a power Le (e.g., as a power sweep) that is used by the reader antenna LA for transmission when addressing RFID chips and/or reading RFIDs, or a combination thereof.

In one embodiment, a coil that is stationary or fixed with regard to a location of the coil relative to the patient table 104 (e.g., the vertebral column coil WS on/in the patient table 104) is equipped with many RFID tags A, B, C, D, . . . , so that by the spatially restricted detection of the RFIDs together with evaluation software (e.g., in the control unit 110 in the MRT), a mobile local coil 106 may determine or leave the position ($x_{RFID}$, $y_{RFID}$, $z_{RFID}$) of the mobile local coil 106 relative to the position ($x_{LA}$, $y_{LA}$, $z_{LA}$) of the stationary RFID reader LA.

Figure 2:
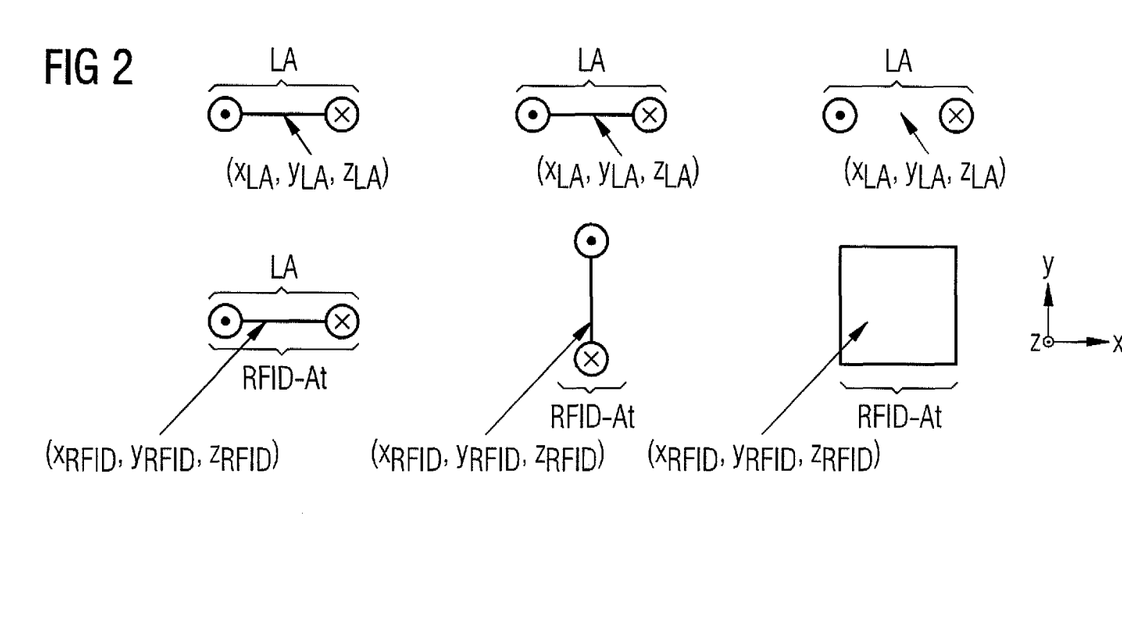
FIG. 2 shows several exemplary spatial positions/arrangements of reader antenna(s) and RFID antennas.

FIG. 2 shows several possible spatial positions/arrangements of reader antenna(s) and RFID antennas relative to each other with regard to the arrangement in direction(s) x, y, z.

For example, FIG. 2 shows exemplary spatial positions/arrangements: on the left-hand side of the reader antenna LA on the z-x plane and the antennas RFID-At on the z-x plane; at the center of the reader antenna LA on the z-x plane and the antennas RFID-At on the y-z plane; or on the right-hand side of the reader antenna LA on the z-x plane and RFID-At on the x-y plane.

Figure 3:
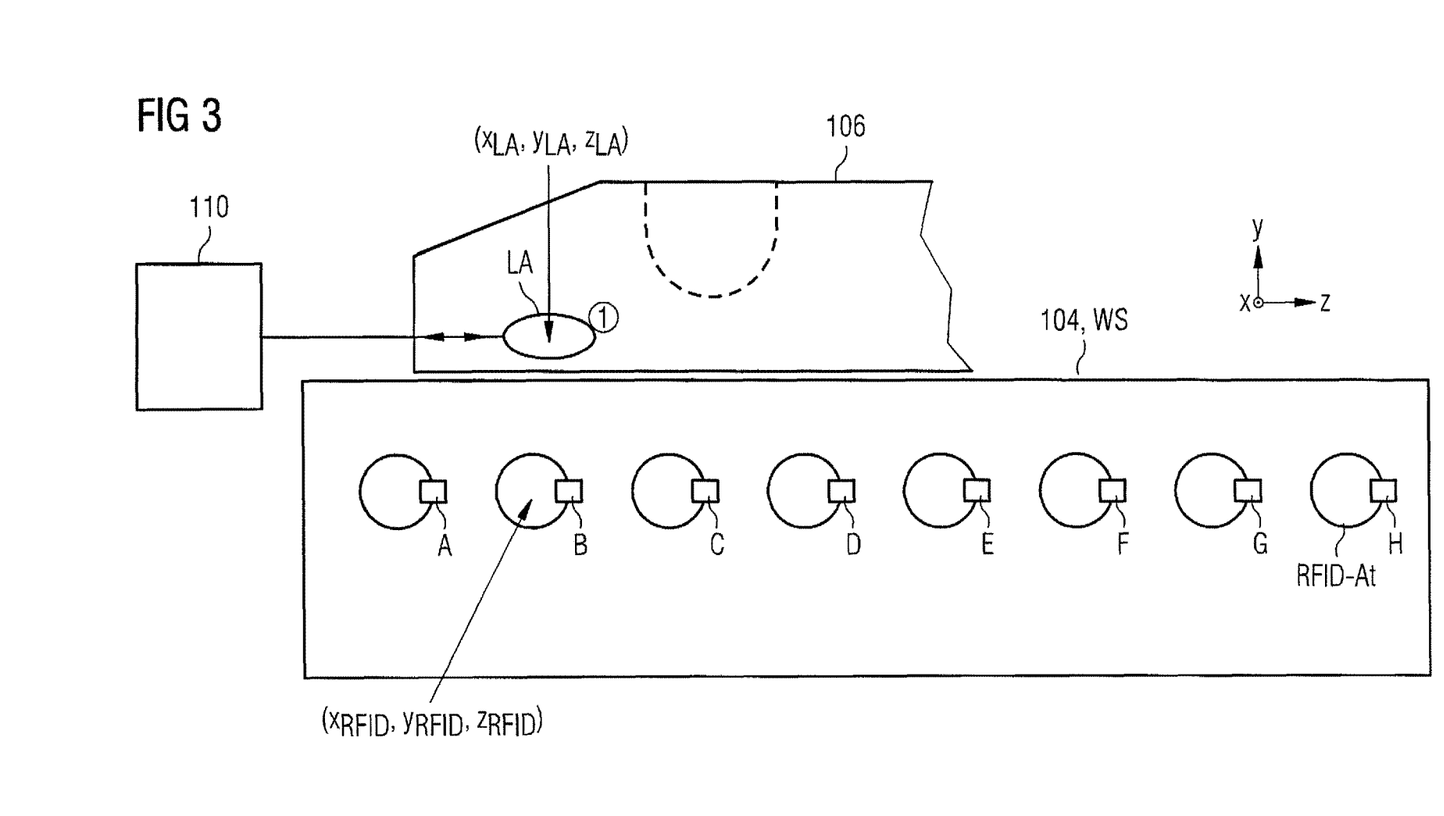
FIG. 3 shows one embodiment of a local chest coil with an RFID reader device above a vertebral column coil and/or patient table with several RFID transmitting systems.

If, for example, according to FIG. 3, the relative position (e.g., in direction x, direction y and direction z), for example, of a breast coil 106 relative to a vertebral column coil WS and/or the table 104 is well known in two directions (e.g., the horizontal position x diagonally to the patient table entry direction and position y vertically to the patient table entry direction z, but not the z position in patient table entry direction z into the MRT bore), the limited RFID reception range d may technically be used for precise location of the breast coil 106 as the relative positions (e.g., from 106 to: A-H and/or 104 and/or WS) are well defined, and the couplings are therefore well defined. This is the case, for example, for local coils 106 that are placed directly on the table 104, on the spine coil WS, or close to the table 104, as the mechanics of the table 104 may have precise specifications with regard to how the local coil 106 may be positioned. In the examples, only position z of the local coil (e.g., breast coil 106), position x and position z (e.g., in the case of a wrist coil 106 or a knee coil), or all three spatial coordinates x, y, z of the local coil (e.g., in the case of an anterior local body coil 106) may be determined. The RFID chips A-H that, in FIG. 3, each transmit via their own antenna RFID-At (and if necessary, for example, receive transmission energy) may be individual structures (i.e., isolated solutions) that are electrically insulated from each other (e.g., to avoid sheath wave problems).

Figure 4:
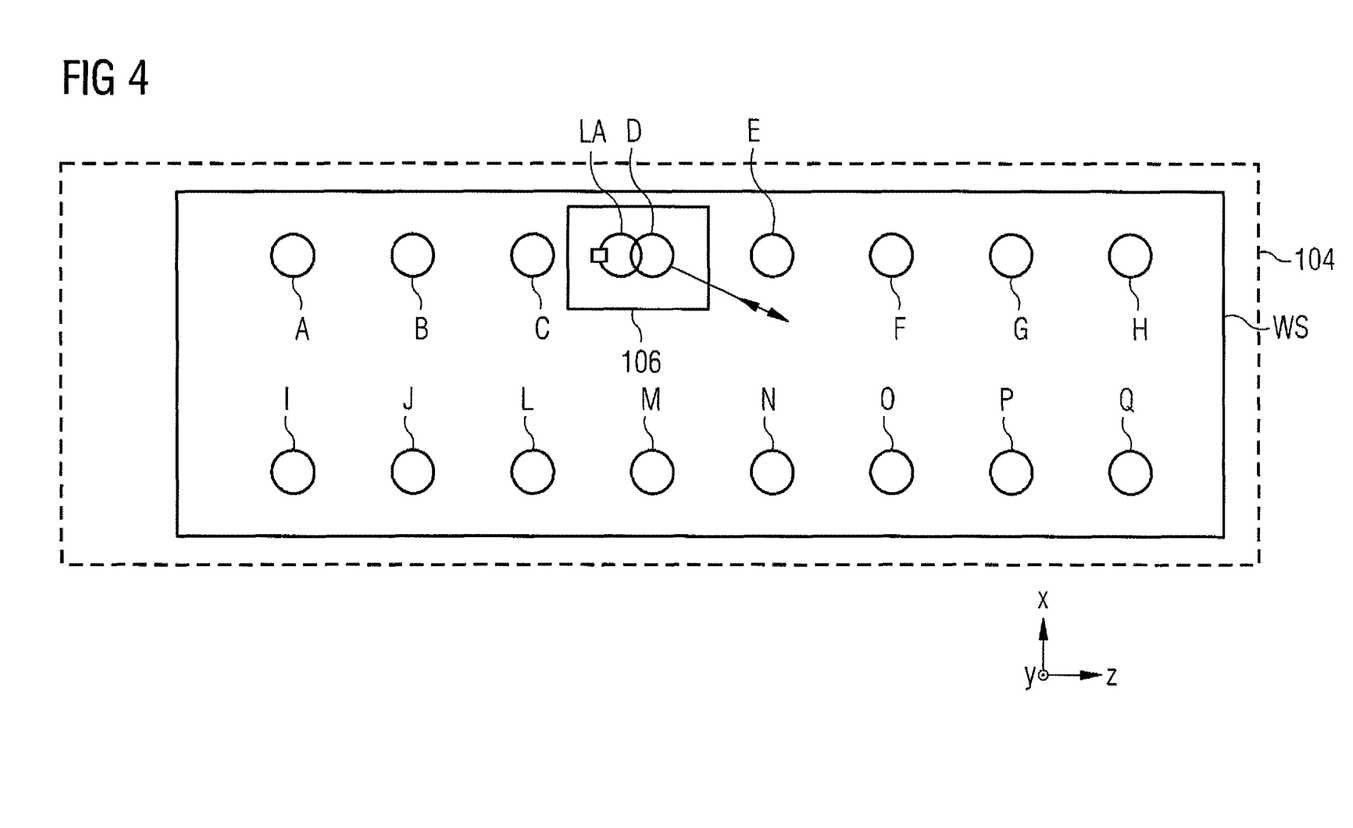
FIG. 4 shows one embodiment of a local wrist coil above a vertebral column coil and/or patient table with several RFID transmitting systems.

As an additional exemplary embodiment shown from above, FIG. 4 shows a wrist coil 106 above a vertebral column coil WS (e.g., inserted in the patient table 104 or positioned on top of the patient table 104), where a reader LG in the wrist coil 106 is spatially located in direction y above the reader of the RFID chip D and consequently closer to this than the other RFID chips A-C, E-H, I-Q. If necessary, depending on the transmitting power selected, an RFID signal is received in the reader LA of the local coil 106 only from RFID chip D or better than from the others, and, for example, a position above this RFID chip D is adopted as the position of the reader LA and therefore of the local coil 106.

Figure 5:
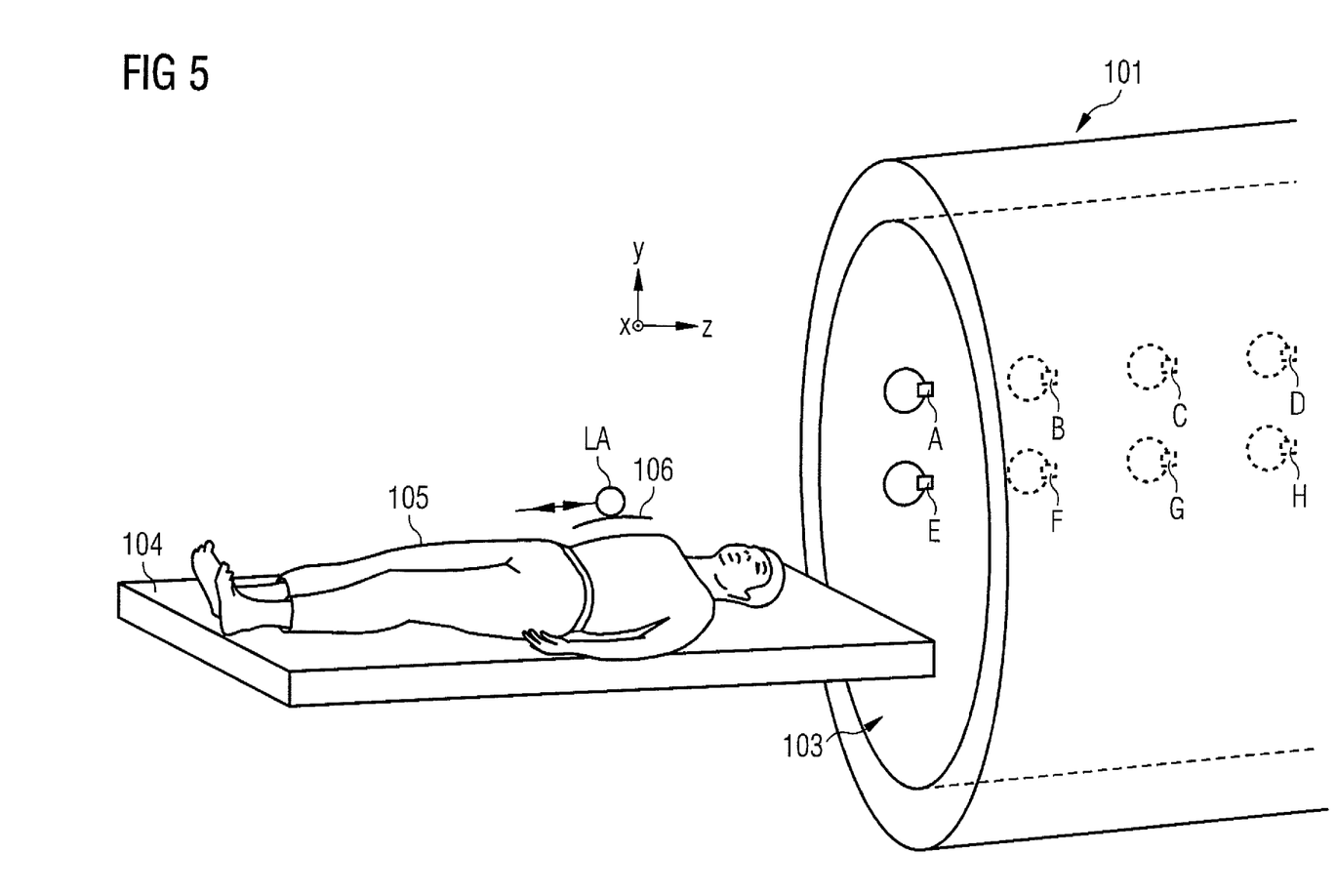
FIG. 5 shows one embodiment of a local anterior coil above a vertebral column coil and/or patient table with several RFID transmitting systems.

FIG. 5 shows a lateral view of an anterior coil 106 as an additional exemplary embodiment placed on a patient on a patient table 104, where a reader LG is arranged in or on the local coil 106. In a positioning device (e.g., installed or attached to the surface) on an MRT system 101 with a local coil positioning system, RFID chips A-D, E-H (e.g., rows/arrays of RFID chips) are located on or in an inner wall of the bore 103 of the MRT 101, and/or RFID chips A-D, E-H (e.g., rows/arrays of RFID chips) are located on the bore entrance of the bore 103 of the MRT 101 on the patient table side (e.g., RFID chip A and RFID chip E<10 cm from the bore entrance).

Reading of RFID chips A-D, E-H with a reader LG in or on the local coil 106 for positioning may take place before the insertion and/or during insertion of the patient table 104 with the local coil 106 into the bore 103 of the MRT (e.g., to position the local coil 106 and consequently the RoI in the FOV).

The arrangements of the RFID chips according to the figures may also be combined.

Therefore, if necessary, using one or more readers in the local coil 106, there may be one or more arrays of RFID chips A-H (e.g., in each case, arranged consecutively in one direction) in the MRT bore inner wall 103, on the MRT bore inner wall entrance 103, on a vertebral column coil WS in a patient table 104, in the patient table 104, or a combination thereof. Several arrays A-D and E-H may also be read out independently of each other.

The RFID tags A-H may be selected from various RFID technologies (e.g., see de.wikipedia.org/wiki/RFID).

The solution using RFID tags is very inexpensive, as active or semi-active RFIDs may be available for <€0.50/unit.

Another advantage of an RFID array (e.g., extended in direction z) is that the individual RFID tags A-D do not have to be galvanically connected to each other and insulated from each other (e.g., the individual RFID tags A-D may be designed individually). As a result, the problem of sheath waves on the RFID array may be prevented by design (e.g., no supply lines to the RFID tags), and an implementation that does not conflict with the high HF fields of the body coil may be selected.

An arrangement that is the inverse of the above arrangement, in which a plurality of multiplexed reader antennas LA only detect one RFID tag in the local coil to be positioned, may be provided. This solution is possible and practical but may be more expensive than the above-described embodiment.

In an additional embodiment, the signal strength and/or additional parameters of the read signal (e.g., amplitude, phase) may be used to obtain further information or greater precision during positioning.

In an additional embodiment, the signals for the readout of the RFID tag on existing cables that are used for other functions (e.g., pin diodes or RF transmission) are transmitted and selected accordingly in the local coil by frequency filters or selector switches. This makes implementation possible without increased cabling expenditure to the local coil.

Figure 6:
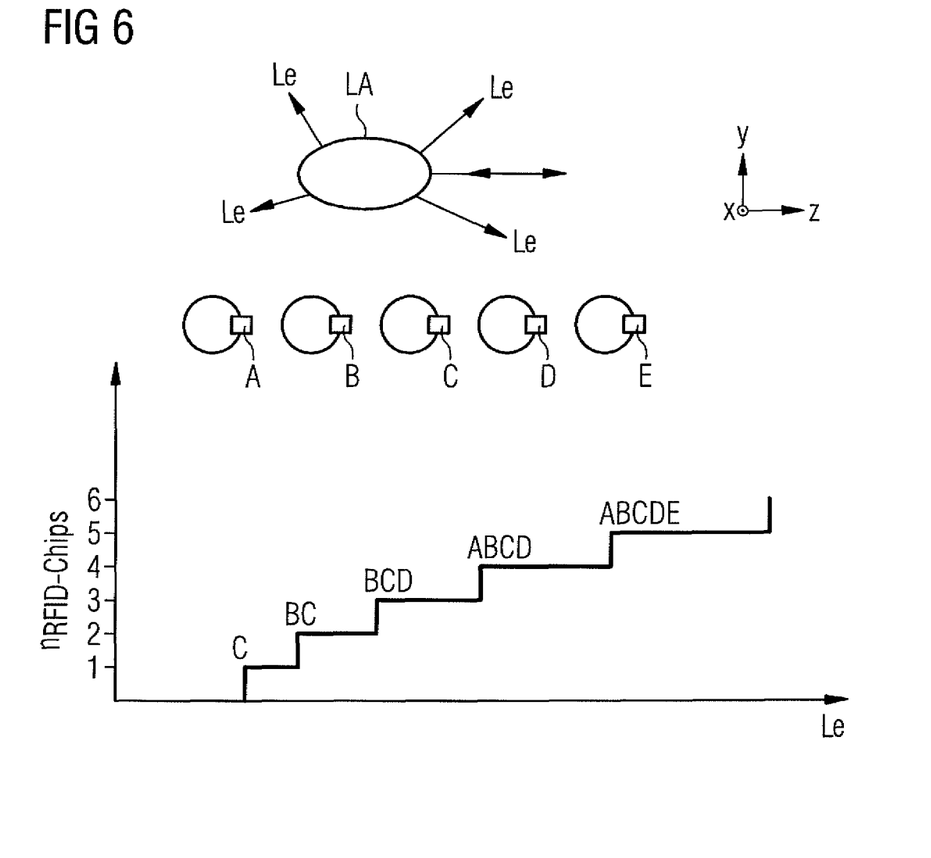
FIG. 6 shows a schematic representation of an exemplary power sweep for a search for an RFID transmitting system/RFID chip closest to a reader device.

As FIG. 6 shows diagrammatically, a power sweep (e.g., alteration of power from a small to a large value and/or vice versa, if necessary in stages) may be used to optimize positioning by detection of the RFID or RFIDs close to a reader. In FIG. 6, a reader LG or at least an antenna of the reader LG (e.g., in the local coil 106) above (e.g., in direction y) an array extending in a direction z of RFID transmitters A-E (e.g., tags or chips) with one antenna each.

In FIG. 6, below the number $n_{RFID\ chips,\ addressed}$ of RFID chips detectable (e.g., addressed) by the reader LA using RFID information received from the RFID chip is indicated as a function of the power Le emitted by the reader LA and/or reception power filtering on the reader side (e.g., in a first power phase Le, a detection of the 1 RFID chip C in the reader LA, in a power phase Le, a detection of the 2 RFID chips B and C in the reader LA, in a power phase Le, a detection of the 3 RFID chips B, C, D in the reader LA, in a power phase Le, a detection of the 4 RFID chips A, B, C, D in the reader LA, in a power phase Le, a detection of the 5 RFID chips A, B, C, D, E in the reader LA).

This information may be used for more precise location of the reader LA.

A positioning device (LG, A-Q) may be used with all the aforementioned details not only as a local coil positioning device (LG, A-Q) but also as a positioning device (LG, A-Q) for other objects (e.g., intervention devices such as needles and ablation devices) and may be transferred to other modalities (e.g., CT, AX, radiotherapy). The positioning device (LG, A-Q) may also be used as a positioning device (LG, A-Q) for applications other than medical applications (e.g., to detect the position of any moving object versus the position of a stationary object with an RFID-reader combination) on account of the spatially restricted coupling of a reader antenna LA and RFID tag antenna.

Local coil position detection based on RFID technology is provided. As a result, existing push-button concepts may become more flexible than in the previous product solution, which is based on inflexible mechanical coding that is difficult to operate. The solution with RFIDs is simple, inexpensive and may be realized in an MR-compatible manner. The system may also be adapted to the mechanical requirements of the respective local coil with great flexibility.

While the present invention has been described above by reference to various embodiments, it should be understood that many changes and modifications can be made to the described embodiments. It is therefore intended that the foregoing description be regarded as illustrative rather than limiting, and that it be understood that all equivalents and/or combinations of embodiments are intended to be included in this description.

The invention claimed is:

1. A positioning device for detection of a position of a magnetic resonance tomography (MRT) local coil relative to a position of a part of an MRT system, the positioning device comprising:
    at least one radio frequency identification (RFID) tag arranged in or on the part of the MRT system and at least one RFID reader arranged on the MRT local coil,
    wherein the positioning device is configured to determine the position of the MRT local coil relative to the position of the part of the MRT system using a signal strength, additional parameters, or the signal strength and the additional parameters of a read signal,
    wherein the at least one RFID tag comprises an array of RFID tags each with an antenna, the array of RFID tags being arranged in a patient table, a vertebral column coil, in a bore of an MRT, or any combination thereof.

2. The positioning device as claimed in claim 1, wherein the part of the MRT system comprises an additional local coil at a location known to an MRT controller, the patient table or the bore of the MRT.

3. The positioning device as claimed in claim 1, wherein an RFID tag of the at least one RFID tag is in a patient table, in a coil of the MRT system arranged on the patient table, at an entrance of an MRT bore, in the MRT bore, or any combination thereof.

4. The positioning device as claimed in claim 1, wherein the positioning device is configured so that when the MRT local coil is on the patient table or on the vertebral column coil on the patient table, a reader antenna in the MRT local coil attempts to receive RFID information from the at least one RFID tag.

5. The positioning device as claimed in claim 1, wherein the at least one RFID reader and the antennas of the at least one RFID tag, respectively, only enable a successful readout of RFID information at certain relative spatial positions, distances from each other, or certain relative spatial positions and distances from each other.

6. The positioning device as claimed in claim 1, wherein the positioning device is configured so that the position of the MRT local coil is determinable from RFID tags of the at least one RFID tag read out successfully on account of spatial positions, distances, or spatial positions and distances.

7. The positioning device as claimed in claim 1, wherein positions of the at least one RFID tag, the at least one RFID reader, or the at least one RFID tag and the at least one RFID reader are stored in a control unit of the MRT system, the MRT local coil, or the MRT system and the MRT local coil.

8. The positioning device as claimed in claim 1, wherein the positioning device is configured so that a spatial restriction of a RFID readout range is used to locate the MRT local coil.

9. The positioning device as claimed in claim 1, wherein the positioning device is configured so that a spatial restriction of an RFID readout range is varied by a layout of the at least one RFID reader, a layout of the antennas of the at least one RFID tag, a sensitivity of the at least one RFID tag, a power that is emitted by the at least one RFID reader, or a combination thereof to read RFID information.

10. The positioning device as claimed in claim 1, wherein a coil with a position that is stationary, or stationary and known with regard to the patient table has the at least one RFID tag, the at least one RFID reader, or the at least one RFID tag and the at least one RFID reader so that a mobile local coil is operable to determine a position of the mobile local coil relative to the at least one stationary RFID tag using a spatial restricted detection of the at least one RFID together with a control unit.

11. The positioning device as claimed in claim 1, wherein the positioning device is configured so that a relative position of the MRT local coil known in two directions relative to the vertebral column coil on the patient table is used perpendicular to a direction of insertion of the patient table into the MRT system, to determine a position of the MRT local coil taking into account a restricted range.

12. The positioning device as claimed in claim 11, wherein the position of the MRT local coil in at least one direction is also determined, and
wherein mechanical specifications of the patient table define the restricted range.

13. The positioning device as claimed in claim 1, wherein the positioning device is configured so that only a z position of the MRT local coil relative to the part of the MRT system is determined.

14. The positioning device as claimed in claim 13, wherein the MRT local coil comprises a breast coil.

15. The positioning device as claimed in claim 1, wherein the positioning device is configured so that only x and z positions of the MRT local coil relative to the part of the MRT system is determined.

16. The positioning device as claimed in claim 15, wherein the MRT local coil comprises a wrist coil.

17. The positioning device as claimed in claim 1, wherein the positioning device is configured so that all three spatial coordinates of a position of the MRT local coil relative to the part of the MRT system are determined.

18. The positioning device as claimed in claim 17, wherein the MRT local coil comprises an anterior body coil.

19. The positioning device as claimed in claim 1, wherein the array of RFID tags are arranged in a row in a direction, in which the patient table is insertable into the bore of the MRT.

20. The positioning device as claimed in claim 1, wherein individual RFID tags of the at least one RFID tag are not galvanically connected to each other.

21. The positioning device as claimed in claim 1,
wherein the positioning device is configured so that the at least one RFID reader detects one or more items of RFID information from one RFID tag of the array of RFID tags in order to determine a position of the MRT local coil relative to the part of the MRT system.

22. The positioning device as claimed in claim 1, wherein the additional parameters comprise amplitude, phase, or amplitude and phase.

23. The positioning device as claimed in claim 1, wherein the positioning device is configured so that signals for a readout of the at least one RFID tag are transmitted on cables also used for other purposes and are selected in the MRT local coil by frequency filters or selector switches.

24. A method for detection of a position of a magnetic resonance tomography (MRT) local coil that is mobile relative to a part of a MRT system, with a positioning device, the positioning device comprising a plurality of radio frequency identification (RFID) tags arranged on or in the MRT local coil, at least one RFID reader antenna arranged on or in the part of the MRT system, or a combination thereof, the method comprising:
determining the position of the mobile MRT local coil relative to the part of the MRT system with the at least one RFID reader antenna and the plurality of RFID tags using a signal strength, additional parameters, or the signal strength and the additional parameters of a read signal of the at least one RFID reader antenna,
wherein the plurality of RFID tags are arranged in a row in a direction in which a patient table is insertable into a bore of the MRT system.

25. A method for detection of a position of at least one magnetic resonance tomography (MRT) local coil in an MRT system, the method comprising:
determining a position of the at least one MRT local coil in the MRT system relative to a part of the MRT system with an array of radio frequency identification (RFID) tags and with one or more RFID receivers using a signal strength, additional parameters, or the signal strength and the additional parameters of a read signal of the one or more RFID receivers,
wherein the array of RFID tags are arranged in a row in a direction in which a patient table is insertable into a bore of the MRT system.

26. A positioning device for detection of a position of a first object relative to a position of an additional object, the positioning device comprising:
a plurality of radio frequency identification (RFID) tags arranged consecutively on the first object in a direction in which a patient table is insertable into a magnetic resonance imaging bore; and
at least one RFID reader arranged on the additional object, wherein the at least one RFID reader is configured to detect one or more items of RFID information from one or more RFID tags of the plurality of RFID tags, such that a position of the local coil relative to the additional object is determinable, and
wherein the positioning device is configured so that a signal strength, additional parameters, or the signal strength and the additional parameters of a read signal of the at least one RFID reader are used for positioning.

* * * * *